United States Patent
Koike

(10) Patent No.: US 7,626,665 B2
(45) Date of Patent: Dec. 1, 2009

(54) COPPER ALLOYS AND LIQUID-CRYSTAL DISPLAY DEVICE

(75) Inventor: Junichi Koike, Sendai (JP)

(73) Assignees: Tohoku University, Sendai-shi (JP); Advanced Interconnect Materials LLC, Sendai-shi (JP)

(*) Notice: Subject to any disclaimer, the term of this patent is extended or adjusted under 35 U.S.C. 154(b) by 282 days.

(21) Appl. No.: 10/572,278

(22) PCT Filed: Aug. 30, 2005

(86) PCT No.: PCT/JP2005/015699

§ 371 (c)(1),
(2), (4) Date: Mar. 16, 2006

(87) PCT Pub. No.: WO2006/025347

PCT Pub. Date: Mar. 9, 2006

(65) Prior Publication Data

US 2007/0002239 A1  Jan. 4, 2007

(30) Foreign Application Priority Data

Aug. 31, 2004 (JP) ............................ 2004-252994

(51) Int. Cl.
G02F 1/1343 (2006.01)

(52) U.S. Cl. .................. 349/139; 349/138; 349/113; 349/12; 349/147; 349/148; 349/46; 349/43

(58) Field of Classification Search ............... 349/139, 349/43, 187, 46, 147–148; 359/51
See application file for complete search history.

(56) References Cited

U.S. PATENT DOCUMENTS

| | | | | |
|---|---|---|---|---|
| 5,351,143 | A | * | 9/1994 | Sato et al. ..................... 349/12 |
| 6,515,726 | B2 | * | 2/2003 | Chae et al. .................. 349/139 |
| 6,961,101 | B2 | * | 11/2005 | Hwang et al. ................. 349/43 |

FOREIGN PATENT DOCUMENTS

| | | | |
|---|---|---|---|
| JP | 57170549 | A * | 4/1981 |
| JP | 57170549 | A * | 10/1982 |
| JP | 3-72045 | | 3/1991 |
| JP | 5-47760 | | 2/1993 |
| JP | 06-097164 | | 4/1994 |
| JP | 10-153788 | | 6/1998 |
| JP | 2862727 | | 12/1998 |
| JP | 11-54458 | | 2/1999 |
| JP | 2000-199054 | | 7/2000 |
| JP | 3220760 | | 8/2001 |
| JP | 2002-069550 | | 3/2002 |
| JP | 2003-64431 | | 3/2003 |
| JP | 2003-277852 | | 10/2003 |
| JP | 2003-332262 | | 11/2003 |
| JP | 2003-342653 | | 12/2003 |
| JP | 2004-091907 | | 3/2004 |
| JP | 2004-91907 | | 3/2004 |
| JP | 2004-139057 | | 5/2004 |
| JP | 2004-163901 | | 6/2004 |
| JP | 2005-158887 | | 6/2005 |
| JP | 2005-166757 | | 6/2005 |
| JP | 2007-072428 | | 3/2007 |
| WO | WO 2006/025347 | A1 | 3/2006 |

* cited by examiner

OTHER PUBLICATIONS

Lanford, W. A. (1995) "Low-temperature Passivation of Copper by Doping with Al or Mg," Thin Solid Films 262, pp. 234-241.
Keizou Iwase and Shozo Okamoto, Normal state diagram of binary alloy, p. 252, Nikkan Kogyo Shimbun, Ltd., in Japan.

Primary Examiner—Brian M. Healy
Assistant Examiner—Guy G Anderson
(74) Attorney, Agent, or Firm—Masuvalley & Partners

(57) ABSTRACT

To provide a highly conductive Cu alloy which is advantageous in that an alloying element added to Cu is first reacted with oxygen contained in a gas atmosphere or solid in contact with the Cu member to form an oxide film which can prevent oxidation of Cu. The copper alloy comprises copper (Cu) containing an inevitable impurity, and an element added to the copper, wherein the added element is capable of being dissolved in the copper in an amount of 0.1 to 20 at. %, wherein the added element has an oxide formation free energy smaller than that of Cu and has a diffusion coefficient in Cu larger than the self-diffusion coefficient of Cu.

8 Claims, 8 Drawing Sheets

COPPER ALLOYS AND LIQUID-CRYSTAL DISPLAY DEVICE

BACKGROUND OF THE INVENTION

1) Field of the Invention

The invention relates to a copper alloy which has a low electric resistance, and can easily form a stable oxide film layer on its surface and its interface, and a liquid crystal display device using the copper alloy in wirings.

2) Description of the Related Art

While many metals suffer oxidation on their surfaces and hence deteriorate in performance, aluminum (Al) and alloys thereof form an Al oxide on their surfaces, and the Al oxide serves as a protective film which can prevent oxidation on the surface. With respect to iron (Fe), Fe itself does not form a protective film, but, in the form of stainless steel which is an Fe alloy containing chromium (Cr), Cr in stainless steel forms a protective film, which can prevent oxidation on the surface.

Cu is similar to Fe, and a Cu oxide is permeable to oxygen, and hence has no ability to prevent oxidation and cannot serve as a protective film. When an appropriate element is added to Cu to obtain a Cu alloy, like Cr in stainless steel, the alloying element in the Cu alloy possibly forms a protective film, which prevents Cu from suffering oxidation. Further, when the protective film is formed at the interface between the film and the adjacent solid, inter-diffusion is possibly prevented.

With respect to the studies on formation of a protective film which prevents oxidation of Cu, many reports have been made from the viewpoint of application to wiring materials for use in electronic devices, which are required to have high electrical conductivity.

For example, Japanese Patent Application Laid-open No. H05-047760 (Patent document 1) entitled "Semiconductor integrated circuit device having Cu wiring on semiconductor substrate" discloses "the Cu wiring is comprised of a Cu alloy containing an element having an electronegativity equal to or larger than that of Cu in an amount in the range from 0.01% by weight to less than 10% by weight".

Japanese Patent Application Laid-open No. H11-054458 (Patent document 2) entitled "Metallization structure" discloses "a first step of depositing by sputtering a copper alloy, which comprises copper and an alloying element in an amount of less than 10 at. %, on a dielectric portion of a substrate having an oxide, and a second step of depositing a layer of copper on the copper alloy".

Japanese Patent No. 2862727 (Patent document 3) entitled "Sputtering target for forming metal thin film and method for producing the same" discloses "a target material made of a high-purity copper alloy comprises a base metal of high-purity copper having a purity equal to or more than 99.9999% by weight, and 0.04 to 0.15% by weight of titanium having a purity equal to or more than 99.9% by weight added to the base metal".

Japanese Patent No. 3220760 (Patent document 4) entitled "Semiconductor device" discloses a semiconductor device which is formed with "a copper compound having such a high corrosion resistance that the relative oxidation number is equal to or less than 50% of that of copper".

Furthermore, "Thin Solid Films", by W. A. Lanford et al., vol. 262 (1995), pp. 234-241 (Nonpatent literature 1) discloses "A copper alloy comprising copper and aluminum or magnesium, which prevents oxidation of copper".

However, the electronegativity described in the Patent document 1 is not sufficient to form an oxide film having high adhesion to the Cu surface. The specification of the Patent document 2 describes that a Cu-2 at. % Mg alloy is heated in air at 400° C. for 30 minutes, so that the oxidation rate of Cu is considerably lowered. When a material having a Cu-(0.05 to 6.0) at. % Mg alloy thin film formed on silicon oxide ($SiO_2$) is subjected to heat treatment at a temperature equal to or less than 400° C., Mg diffuses to the interface between the copper alloy and $SiO_2$ during the heat treatment to form a protective film, thus preventing inter-diffusion between Cu and the $SiO_2$ constituent elements. However, it has been known that a Cu—Mg alloy being heated at 600° C. reduces $SiO_2$ to diffuse Si atoms into Cu, increasing the electric resistance of Cu. In addition to the reports on the copper alloy containing Mg, there are reports on the formation of protective films from alloys containing Al or Ti, but these alloying elements have a drawback in that they increase the electric resistance of Cu. The Patent document 3 has a problem in that titanium remains as a solid solution element or forms an inter-metallic compound to increase the electric resistance. In the Patent document 4, a copper compound having such a high corrosion resistance that the relative oxidation number is equal to or less than 50% of that of copper is formed on the surface of copper, which poses a problem in that the productivity is low due to the formation of a compound. The Nonpatent literature 1 has a problem in that both the Cu—Mg alloy and Cu—Al alloy subjected to heat treatment are increased in electric resistance.

Recently, in substrates having mounted electronic parts, such as a resistance, a capacitor, and a quartz clock, semiconductor elements, such as a TFT, a CMOS, and an FRAM, and semiconductor devices having mounted them, examples of wiring materials conventionally used include high melting-point metals, such as Mo and Cr, but these metals have a problem in that they have low conductivity. When, instead of them, aluminum (Al) having high conductivity is used in wirings, the conductivity can be considerably increased. In addition, aluminum (Al) and alloys thereof form Al oxide on their surfaces, which serves as a protective film to prevent oxidation on the surface. However, Al poses problems of the formation of Hillocks and the occurrence of electromigration.

For solving the problems, for example, Japanese Patent Application Laid-open No. 2000-199054 has proposed an Al—Nd alloy, which is used in advanced display devices. Al—Nd has an electric resistance lower than that of Cr; however, Al and Nd do not form solid solution, making it difficult to produce a sputter target. Further, the Al—Nd alloy contains Nd, which disadvantageously makes it difficult to lower the electric resistance of the alloy.

On the other hand, materials having higher conductivity are demanded, and, for meeting the demands, wirings comprised of a Cu alloy are being studied. Particularly, Cu has an electric resistance lower than that of Al and is unlikely to form Hillocks, and therefore Cu is a promising wiring material in the next generation. However, Cu has a problem in that it has poor adhesion to a substrate of glass, for example, and is likely to suffer oxidation. In addition, Cu has another problem in that Cu and an insulating layer of $SiO_2$ or SiN undergo inter-diffusion and thus the electric properties deteriorate. For solving these problems of Cu wiring, Japanese Patent Application Laid-open No. 2004-139057 has proposed a method for forming around Cu a nitride having a high melting point, such as TaN, TiN, or WN. Differing from conventional wiring materials, however, this method requires a material for barrier layer and an additional process for forming the barrier layer and poses a problem in that the barrier layer having a high resistance and a large thickness is formed to increase the effective resistance of the wiring. Japanese Patent Application Laid-open No. 2004-91907 has proposed that 0.1 to 3.0 wt. % of Mo is added to Cu so that Mo segregates in the grain boundary, preventing oxidation due to the grain boundary diffusion. This method improves Cu in oxidation resistance, but involves a problem that the wiring resistance is increased.

Especially in the semiconductor devices, in recent years, liquid crystal display devices are widely used in a variety of fields of displays wherein the liquid crystal display devices have advantages in that they are small in thickness and lightweight and can be driven with a low voltage and cause small power consumption. The liquid crystal display device generally has a structure such that liquid crystal is sealed between two transparent glass substrates. A black matrix, a filter, a common electrode, and an oriented film are formed on the inner surface of one substrate, and a thin film transistor (TFT), a gate wiring, a signal wiring, a pixel electrode, and an oriented film are formed on the inner surface of another substrate. For example, three pixel electrodes are positioned to color filters of the three primary colors to define one pixel unit, and a number of the pixel units are arranged in rows and columns to constitute a color display in a plane form. An actual image is formed by a procedure in which the rows of pixels are successively selected by the gate wiring and an image signal is fed from the signal wiring to the pixel electrodes on the same row at the same time to operate the three primary-color pixel electrode of each pixel, defining an image. The TFT used in the liquid crystal display device is produced as follows. A gate wiring is first formed on a substrate and covered with a gate insulator film, and then an amorphous silicon layer constituting a channel layer is formed. A channel protecting film is formed in the channel region of the amorphous silicon layer, and then an amorphous silicon layer for contact having a high impurity density, and metal layers constituting a source/drain electrode and a signal wiring are formed in source/drain regions on the both sides of the channel region and patterned, and then covered with an insulating protective film. The operation speed of the TFT in the liquid crystal display device largely depends on the conductivity of a gate wiring and the capacity generated in the gate wiring. Increasing the conductivity of the gate wiring can improve the operation speed.

With respect to the display device, Japanese Patent Application Laid-open No. 2003-277852 discloses a copper metallizing composition comprising, relative to 100 parts by mass of copper powder, 0.5 to 8 parts by mass of a glass component and 0.05 to 3 parts by mass of a composite oxide comprised mainly of Zn, Mg, and Ti. There can be provided a copper metallizing composition which is advantageous in that it has improved adhesion strength and excellent solder wettability and suppresses warpage of a wiring substrate, and a ceramic wiring substrate using the composition.

Japanese Patent Application Laid-open Nos. 2003-332262 and 2003-342653 disclose a wiring material comprised of a Cu alloy for use in a wiring substrate, wherein the Cu alloy comprises any one of Au and Co or both and Cu, wherein the Cu content is 80 to 99.5 wt % and the sum of the Au content and the Co content is 0.5 to 20 wt %. There can be provided an alloy having improved adhesion to a glass substrate or silicon film. Japanese Patent Application Laid-open No. H10-153788 discloses a liquid crystal display device which comprises a wiring layer having a conductive layer comprising a material comprised mainly of at least one first metal selected from the group consisting of Ag, Au, Cu, Al, and Pt and comprised of at least one second metal selected from the group consisting of Ti, Zr, Hf, Ta, Nb, Si, B, La, Nd, Sm, Eu, Gd, Dy, Y, Yb, Ce, Mg, Th, and Cr, and an oxide layer covering the surface of the conductive layer and comprising a material comprised mainly of the second metal. High resistance to chemical treatment in the production process and excellent adhesion to the substrate can be achieved, thus preventing the wiring layer from suffering burnout.

However, in the above disclosed techniques, Cu oxide is permeable to oxygen and hence has no ability to prevent oxidation and cannot serve as a protective film. Especially when an appropriate element is added to Cu to obtain a Cu alloy, an additive element possibly forms a protective film which can prevent oxidation of Cu. However, the additive element does not diffuse satisfactorily and is difficult to form a strong oxide film.

The disclosed techniques have problems in that, when Cu is in contact with a gas atmosphere containing oxygen or a solid material containing oxygen, oxidation of Cu or interdiffusion between Cu and the adjacent solid phase inevitably occurs, so that the high conductivity inherent in Cu cannot be maintained. For solving these problems, an attempt is made to add an alloying element to Cu to form a protective film, but other problems occur in that the resultant Cu alloy has poor thermal stability and an increased electric resistance.

The invention has been achieved in view of the above, and an object is to provide a highly conductive Cu alloy which is advantageous in that an alloying element added to Cu is first reacted with oxygen contained in a gas atmosphere or solid in contact with the Cu member to form an oxide film which can prevent oxidation of Cu.

The conventional wiring materials have a problem in that they cannot produce a liquid crystal display device which comprises a wiring layer having an oxide layer having high conductivity and having a strong protective layer on the surface of a wiring.

The invention has been achieved in view of the above, and another object of the invention is to provide a semiconductor device, particularly a liquid crystal display device comprising a highly conductive wiring or electrode which is advantageous in that the alloying element added to Cu is first reacted with oxygen contained in a gas atmosphere or solid in contact with the Cu member to form an oxide film which can prevent oxidation of Cu.

SUMMARY OF THE INVENTION

Features of the invention, which are directed to solving the above problems, are mentioned below.

The Cu alloy of the invention is a copper alloy comprising an additive element capable of being dissolved in copper (Cu) containing an inevitable impurity, wherein the additive element has an absolute value of oxide formation free energy or oxide formation enthalpy larger than that of Cu and has a diffusion coefficient in Cu larger than the self-diffusion coefficient of Cu.

In the Cu alloy of the invention, the additive element may have an activity coefficient $\gamma$ in Cu, which satisfies a relationship of "activity coefficient $\gamma$">1.

Accordingly, the additive element is dissolved in Cu in the Cu alloy without forming an ordered alloy or the like, and more easily forms an oxide than Cu and therefore the additive element can reach the surface of the Cu alloy to form an oxide film layer before a layer of Cu oxide is formed.

The Cu alloy can be used in a semiconductor device or circuit board having an electric wiring or electrode for semiconductor device or electronic part.

The liquid crystal display device according to the invention comprises a metal wiring or electrode formed from a copper (Cu) alloy containing an additive element having an absolute value of oxide formation free energy or oxide formation enthalpy larger than that of Cu and having a diffusion coefficient in Cu larger than the self-diffusion coefficient of Cu.

According to the liquid crystal display device according to the invention, the additive element has an activity coefficient γ in Cu, which satisfies the relationship of "activity coefficient γ">1.

In the liquid crystal display device, an oxide film can be easily formed on a metal wiring or electrode without inhibiting the conduction properties.

DETAILED DESCRIPTIONS OF THE INVENTION

Figure 1:
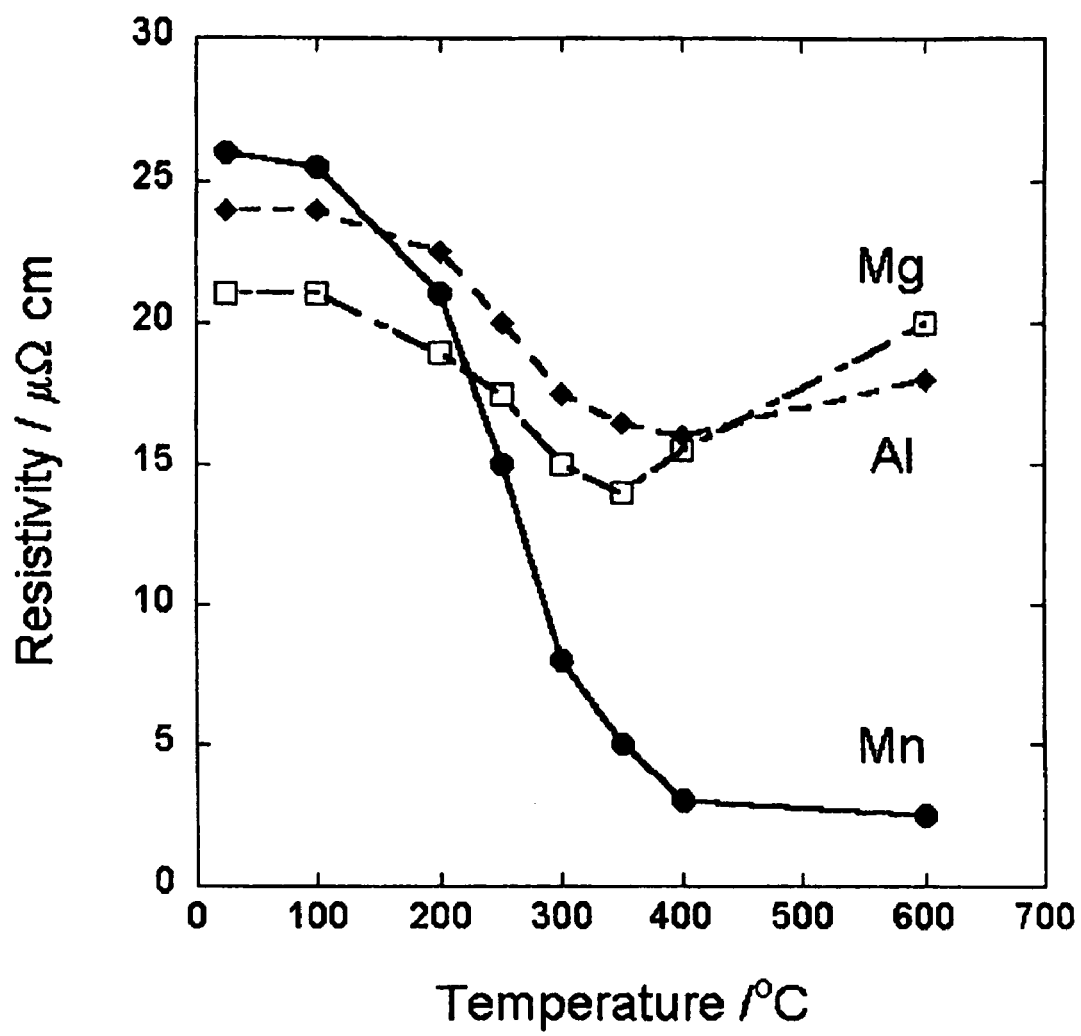
FIG. 1 is a graph showing a relationship between heat treatment temperature and electric resistance.

Exemplary embodiments of the invention will be explained below with reference to the accompanying drawings. Since other embodiments will readily occur to those skilled in the art through changes and modifications of the invention within the spirit or scope of the invention, the other embodiments are embraced in the scope of the invention. Therefore, the following explanations of the embodiments are only exemplary and are not intended to limit the scope of the invention.

The invention is directed to a copper alloy which comprises copper (Cu) containing an inevitable impurity, and an element added to the copper, wherein the additive element is capable of being dissolved in the copper, wherein the additive element has an oxide formation free energy larger than that of Cu and has a diffusion coefficient in Cu larger than the self-diffusion coefficient of Cu. The copper alloy (Cu alloy) has high electrical conductivity and a tensile strength higher than that of Al, and hence is used in wirings, pins, or connectors for use in wiring substrate having electronic parts, semiconductor device, or liquid crystal display device.

In the Cu alloy of the invention, the additive element is a metal element having an absolute value of oxide formation free energy or oxide formation enthalpy larger than that of Cu. In a certain state, for example, in a solid state, the oxide formation free energy and the oxide formation enthalpy increase or decrease similarly. The larger the negative value of the oxide formation free energy (ΔG: kJ/mol) or oxide formation enthalpy (ΔH: kJ/mol), the higher the reactivity with oxygen (O). For forming an oxide film layer on the surface of the Cu alloy, an element having a negative value of oxide formation free energy or oxide formation enthalpy larger than that of Cu is added.

Further, in the Cu alloy of the invention, the additive element is a metal element having a diffusion coefficient in Cu (hereinafter, simply as "diffusion coefficient", unless otherwise specified) larger than the self-diffusion coefficient of Cu.

The additive element having a diffusion coefficient larger than the self-diffusion coefficient of Cu quickly reaches the surface of Cu, so that an oxide film layer comprised of the additive element can be first formed on the surface of the Cu alloy. In contrast, the additive element having a diffusion coefficient smaller than the self-diffusion coefficient of Cu cannot quickly reach the surface of the Cu alloy, so that an oxide film layer of CuO or $Cu_2O$ is formed on the surface of the Cu alloy. Further, oxygen goes into the Cu alloy from the surface of the Cu alloy to form an oxide of the additive element inside the Cu alloy. Oxygen relatively easily moves through the oxide film layer comprised of, for exasmple, $Cu_2O$, and this layer has a high oxygen diffusion rate and hence advances oxidation of Cu to reduce Cu in a metallic state, thus causing a problem in that the electric resistance is increased when used in, for example, a semiconductor device.

In the Cu alloy of the invention, the additive element may have an electric resistivity increase rate equal to or less than 5 μΩcm in Cu per 1 at. %. The electric resistivity increase rate of the additive element depends on, for example, a relationship between the atomic radius or electronic state of the additive element and Cu atoms. When the electric resistivity increase rate in Cu per 1 at. % is more than 5 μΩcm, the resultant copper alloy has an electric resistance as high as that of the aluminum alloy currently used, nullifying the advantage of use of the copper alloy.

In the Cu alloy of the invention, the additive element may have an activity coefficient in Cu of more than 1.0. This activity coefficient is also called activity, and defined by the following formula (1):

$$\mu_i = \mu_i^\circ + RT \ln \gamma_i N_i \tag{1}$$

wherein $\mu_i$ represents a chemical potential of i component, $\mu_i^\circ$ represents a chemical potential of i component in the standard state, $\gamma_i$ represents an activity coefficient, and $N_i$ represents a molar fraction.

Activity coefficient $\gamma_i$ indicates interaction in Cu, and, when "activity coefficient $\gamma_i$">1, i component is released from Cu and diffuses in Cu. When "activity coefficient $\gamma_i$"<1, i component attracts Cu and remains in Cu. Further, when "activity coefficient $\gamma_i$"<1, the additive element as i component and Cu narrow the solubility limit and hence are more likely to form an ordered alloy or intermetallic compound.

The element added to the Cu alloy having activity coefficient $\gamma_i$ in Cu of more than 1 is released from Cu atoms and easily diffuses. Further, the additive element quickly reaches the surface of the Cu alloy and is more likely to be oxidized than Cu, thus forming an oxide film layer on the surface of the Cu alloy. The additive element having an activity coefficient of less than 1 is likely to remain in Cu and hence hardly reaches the surface of the Cu alloy, so that an oxide film layer cannot be formed, leading to a problem in that oxidation of Cu proceeds.

The activity coefficient was measured as follows. The copper alloy is dissolved in a Knudsen cell, and the composition dependency of an ion current is measured by means of a mass spectrometer. The results were analyzed using an integral equation of Belton-Fruehan in order to obtain an activity coefficient.

In the Cu alloy of the invention, the additive element used is capable of being dissolved in the Cu alloy in the range from 0.1 to 20.0 at. %. The solubility limit means a range such that the α phase of the additive element or an ordered alloy, such as an intermetallic compound, is not deposited in the Cu alloy.

When a different phase is deposited in the Cu alloy, the conductivity of the Cu alloy is markedly lowered. For example, even in the Cu alloy having conductivity as high as that of Cu, deposition of a different phase causes the interface between the phase and Cu in the alloy to break the arrangement of metals, making the movement of electrons difficult. Therefore, it is required that the additive element being dissolved in Cu. Further, the additive element, which is not dissolved in the Cu alloy, hardly diffuses. Particularly, when the additive element and Cu form an inter-metallic compound, the additive element rarely diffuses.

The additive element is contained in the Cu alloy in an amount in the range from 0.1 to 20.0 at. %. When Mn is added in an amount of less than 0.1 at. % to the Cu alloy, the resultant oxide film layer has too small a thickness to prevent oxidation of Cu. When the amount is more than 20.0 at. %, the conductivity of Cu is lowered, or the $\alpha$ phase of the additive element is likely to be deposited at about room temperature.

The element added to the Cu alloy may be at least one metal selected from the group consisting of Mn, Zn, Ga, Li, Ge, Sr, Ag, In, Sn, Ba, Pr, and Nd. These metals may be used in combination. Each of these metals forms on the surface of Cu an oxide film layer which can prevent Cu from suffering oxidation in an oxidative atmosphere containing oxygen. More preferred are Mn, Ga, and Li. They have a large diffusion rate in the Cu alloy. Particularly, Mn has a melting point higher than that of Cu, but it is more likely to form an oxide than Cu, and further it forms an oxide which rarely transmits oxygen. Ga and Li have a melting point lower than that of Cu and a larger diffusion rate, and therefore they have a high rate of forming an oxide film layer on the surface of the Cu alloy, making it possible to suppress the loss of Cu.

The Cu alloy of the invention may contain an impurity inevitably mixed, such as S, Se, Te, Pb, Sb, or Bi, in such an amount that the conductivity or strength of the copper alloy of the invention is not sacrificed. In the Cu alloy of the invention, the content of an impurity element having a diffusion coefficient in Cu at 400° C. smaller than the self-diffusion coefficient of Cu is equal to or less than 0.1 at. %, preferably equal to or less than 0.05 at %. An element having a small diffusion coefficient stays in the Cu alloy for a prolonged time, and forms an oxide, together with oxygen (O) which has intruded into the Cu alloy, and the resultant nonmetal-containing substance considerably lowers the conductivity of the Cu alloy. Therefore, when the impurity element content exceeds 0.1 at. %, the conductivity of the Cu alloy is markedly lowered. Particularly, examples of impurity elements include metals, such as Mg, Al, Cr, Fe, Co, Ni, Nb, Ru, Ir, Pd, and V. Especially, the impurity element having a small diffusion coefficient remains in Cu as a solid solution element, is deposited at the grain boundary or in the grain, or forms an oxide to constitute a nonmetal-containing substance, thus considerably lowering the conductivity.

The copper alloy of the invention can be used in the form of a wiring comprised of the Cu alloy on, for example, a display device, semiconductor device, or wiring substrate. With respect to the method for using the Cu alloy, there is no particular limitation. A plating process, such as an electrolytic plating process or a melt plating process, or a physical vapor deposition process, such as a vacuum vapor deposition process or a sputtering process, can be used. The thus formed Cu alloy is subjected to heat treatment in an oxidative atmosphere containing oxygen, so that the additive element diffuses and reaches the surface of the Cu alloy and is oxidized faster than Cu, thus forming an oxide film layer. For example, when Mn is added as the additive element, MnOx is formed on the surface of the Cu alloy. A (Cu, Mn)Ox composite oxide containing Cu may be formed in the oxide film layer, and the oxide film layer may be formed from any oxide.

This oxide film layer is formed so as to have a thickness of 1 to 10 nm. The thickness of the oxide film layer depends on the diffusion amounts or diffusion rates of the constituent additive element, Cu, and oxygen in the oxide film layer. Therefore, the thickness varies depending on the temperature or time of heat treatment and the properties of the oxide film layer formed. An oxide of the additive element, e.g., Mn suppresses the diffusion amounts or diffusion rates of the additive element, Cu, and oxygen, and hence can prevent the oxide film layer from growing to have too large a thickness. For this reason, the thickness of the oxide film layer substantially does not exceed 10 nm. Further, the oxide film layer having a thickness equal to or more than 1 nm can exhibit insulation properties with respect to the Cu alloy. Therefore, it is preferred that the oxide film layer is formed so as to have a thickness of 1 to 10 nm. For efficiently forming the oxide film layer having a thickness equal to or more than 10 nm, it is necessary to increase both the temperature and time of the heat treatment.

The additive element is subjected to heat treatment at a temperature in the range from 200 to 600° C., preferably for a period of time in the range from 5 minutes to 2 hours. When the temperature of the heat treatment is lower than 200° C., the formation of an oxide film requires a prolonged time, lowering the productivity. When the temperature of the heat treatment is higher than 600° C., a problem occurs in that Cu is oxidized to form an oxide film layer before the element added to the Cu alloy diffuses and reaches the surface. When the time of the heat treatment is shorter than 5 minutes, the oxide film layer does not grow to have a satisfactory thickness, and, when the time of the heat treatment is longer than 2 hours, the thickness of the oxide film layer substantially does not change any more, and hence the heat treatment for such a long time is meaningless.

In the copper alloy of the invention, when the Cu alloy is in contact with an oxide layer or another metal layer, an oxide film layer containing the additive element can be formed at the interface between the copper alloy and the oxide layer. In this case, when the additive element has an absolute value of oxide formation free energy smaller than that of the element in the oxide layer, the oxide film layer can be formed using oxygen introduced from the outside without reducing the oxide to remove oxygen therefrom. When the Cu alloy is in contact with another metal layer in an oxidative atmosphere, an oxide film layer can be formed at the interface between the copper alloy and the metal layer.

For example, with respect to $SiO_2$ used as an insulating material for forming a liquid crystal display device or semiconductor device, the Cu alloy, which contains, as the additive element, Mn having an absolute value of oxide formation free energy smaller than that of Si, and which is in contact with $SiO_2$, is subjected to heat treatment to form a composite oxide film layer comprised of (Cu, Mn, Si) Ox containing Mn at the interface between the Cu alloy and $SiO_2$. When the additive element has an absolute value of oxide formation free energy larger than that of the metal in the oxide layer, part of the oxide layer can be reduced to form a strong oxide film layer. In any case, an oxide film layer can be formed at the interface between the oxide layer and the Cu alloy.

As the additive element, Mn is especially preferred. In the Cu alloy containing Mn, Mn oxide is formed as an oxide film on the surface, or a composite oxide comprising Mn and at least one element selected from the constituent elements of the solid adjacent to the Cu alloy is formed as an oxide film at the interface. Mn is dissolved in Cu at about 20 at. % at room temperature, and has a larger solid solubility at higher temperatures, and therefore the alloy material containing Mn is easy to dissolve or cast, and a sputter target can be easily prepared from the alloy material. In addition, Mn oxide has an absolute value of formation energy larger than that of Cu oxide, and hence Mn diffuses to the surface or interface to form an Mn oxide first. Further, the diffusion coefficient of Mn in Cu is larger than the self-diffusion coefficient of Cu, and therefore Mn reaches the surface or interface to form an oxide film first before Cu is markedly oxidized.

Activity coefficient γ of Mn in Cu is larger than 1.0, and therefore Mn cannot be dissolved in Cu due to the driving force of forming an Mn oxide and is separated from Cu to form an oxide film on the surface or interface. Even when Mn is added in an amount larger than the appropriate amount and remains in Cu, the electric resistivity increase rate of the remaining Mn per 1 at. % is as small as 2.8 μΩcm, and therefore a marked lowering of the conductivity does not occur. In addition, Mn has activity coefficient γ equal to or more than 1, and therefore appropriate selection of an oxidative atmosphere completely separates Mn from Cu to lower the electric resistance of the alloy to the level of pure copper. The thus formed Cu—Mn alloy can keep both excellent electrical conductivity and excellent oxidation resistance. Further, even when the adjacent solid material is $SiO_2$, the absolute value of oxide formation free energy of Mn is smaller than that of Si and hence, unlike Mg, Mn does not reduce $SiO_2$ to diffuse Si atoms into Cu.

FIG. 1 is a graph showing a relationship between the heat treatment temperature and the electric resistance. When the Cu alloy containing Mn as the additive element is subjected to heat treatment at a temperature equal to or more than 400° C., the electric resistance of the Cu alloy is lowered to a value close to 1.7 μΩcm, which is the electric resistance of pure Cu. In contrast, with respect to the Cu alloy containing Mg or Al, the electric resistance is lowered as the temperature of the heat treatment rises, but the electric resistance gradually increases at about 400° C. or higher, which indicates that drastic reduction of the resistance as can be seen in Mn is not found. The reason for this resides in that the growth of crystal grains of the Cu alloy lowers the electric resistance, but Mg or Al is dissolved in Cu due to their small activity coefficient of less than 1.0 to increase the electric resistance. Further, Mg or Al reduces $SiO_2$ to diffuse Si into Cu, thus increasing the electric resistance.

The Cu alloy can be used as a sputter target material. Mn, Zn, Ge, Sr, Ag, Cd, In, Sn, Ba, Pr, or Nd dissolved in Cu prevents the occurrence of accidental discharge during the sputtering, making it possible to form a uniform film free of voids. In addition, a sputtered film formed from the Cu alloy has highly uniform thickness, which can remarkably improve the yield, and, by subjecting the sputtered film to heat treatment, an oxide film layer can be formed on the surface or at the interface between the sputtered film and the oxide layer.

An electrode film used in a conductor or liquid crystal is required to have a low specific resistivity, and therefore conductive thin films using Cu sputtering target materials have been widely used. Accordingly, the Cu alloy of the invention is molten and alloyed by a casting process to produce a sputtering target material. Casting in a vacuum can prevent Mn or the like from suffering oxidation. Further, the element added to the Cu alloy has a large diffusion coefficient and has activity coefficient γ larger than 1, and therefore a uniform sputtering target material free from segregation can be obtained.

The Cu alloy of the invention can be used as a wiring material for use in a liquid crystal display device or semiconductor device. It is especially preferred that the Cu alloy is used in a liquid crystal display device. The liquid crystal display device comprises a pair of substrates, a liquid crystal layer sandwiched between the substrates, an electrode formed on the surface of the substrate on the liquid crystal layer side, and a wiring layer disposed on the surface of the substrate and electrically connected to the electrode.

Figure 2:
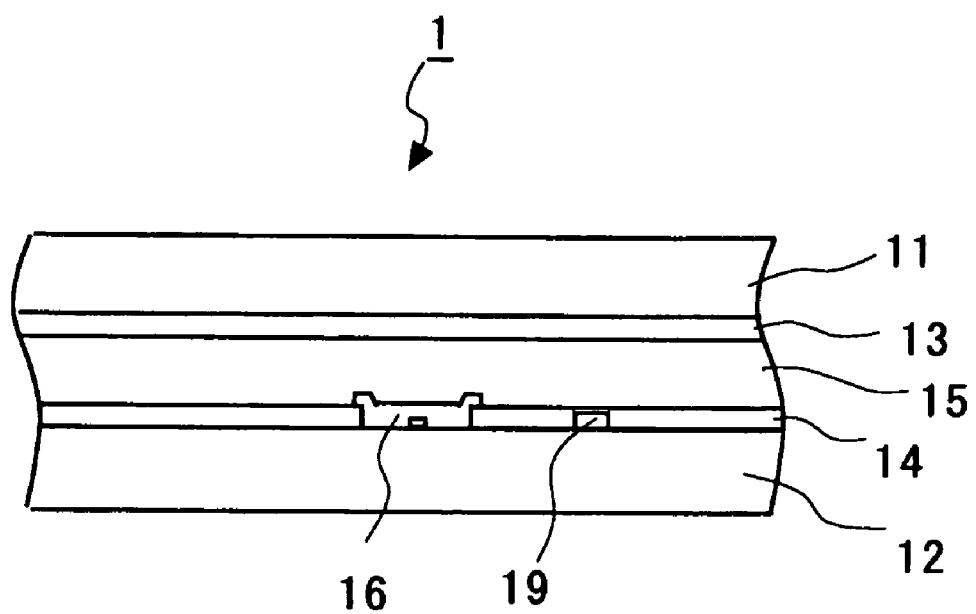
FIG. 2 is a schematic diagram of a configuration of the liquid crystal display device according to the invention.

FIG. 2 is a schematic diagram of a configuration of the liquid crystal display device according to the invention.

The liquid crystal display device (hereinafter, "LCD") according to the invention is of an inverted staggered structure TFT type, but the liquid crystal display device is not limited to this type, and can be applied to an etching stopper/inverted staggered structure, back channel/inverted staggered structure, or staggered structure TFT. The semiconductor film used in the TFT is not limited to an a-Si film, and may be a polysilicon film. It may be used not only in a gate line but also in a signal line or an electrode of source/drain.

As shown in FIG. 2, a liquid crystal display device 1 comprises a transparent substrate 11 comprised of glass having on one side a transparent common electrode 13 comprised of an ITO (indium tin oxide) film, and a facing transparent substrate 12 having on one side a transparent pixel electrode 14 comprised of an ITO film, wherein the transparent substrates are disposed so that the respective surfaces on the electrode side face each other. The substrates 11, 12 are disposed through a substrate spacer at a space of several μm, which is filled with a liquid crystal layer 15, and the periphery is sealed. That is, the liquid crystal layer 15 is sandwiched between a pair of substrates.

Figure 3:
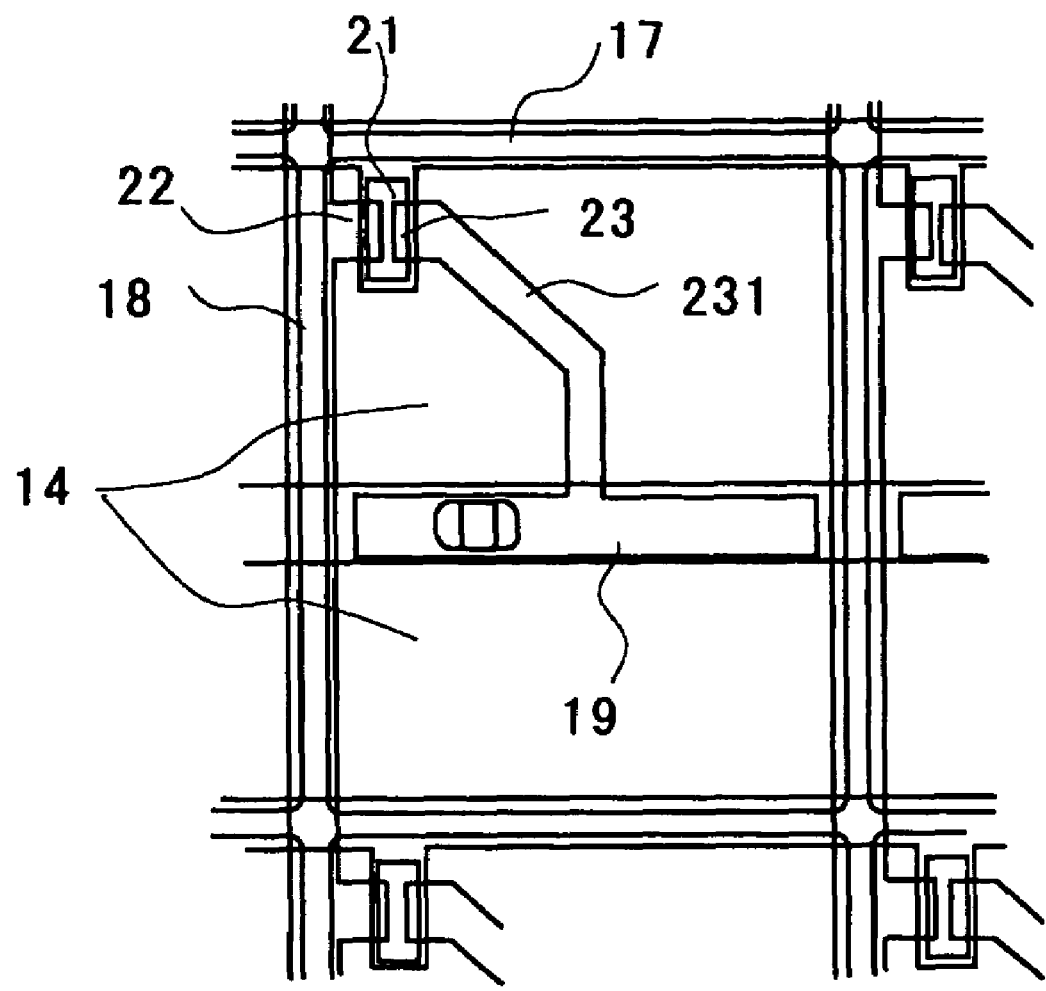
FIG. 3 is a schematic diagram of a pixel configuration in the liquid crystal display device according to the invention.

FIG. 3 is a schematic diagram of a pixel configuration in the liquid crystal display device according to the invention.

On the facing substrate 12 having thereon the pixel electrode 14, the pixel electrode 14, a TFT switching element 16, a gate line 17, a signal line 18, and a stored capacity line 19 are disposed two-dimensionally so that they are equivalent to the circuit from the viewpoint of plane. Specifically, the gate lines 17 extending in the row direction of the image display and the signal lines 18 extending in the column direction are disposed in a matrix, and the stored capacity line 19 is disposed in parallel to each of the gate line 17. The TFT switching element 16 and the pixel electrode 14 are formed in a region unit defined by the gate line 17 and the signal line 18, and the TFT switching element 16 is electrically connected to the gate line 17 and the signal line 18 at the corner of the region unit. That is, a drain electrode 22 of the TFT is connected to the signal line 18, a source electrode 23 is connected to the pixel electrode 14, and a gate electrode 21 is connected to the gate line 17.

Figure 4:
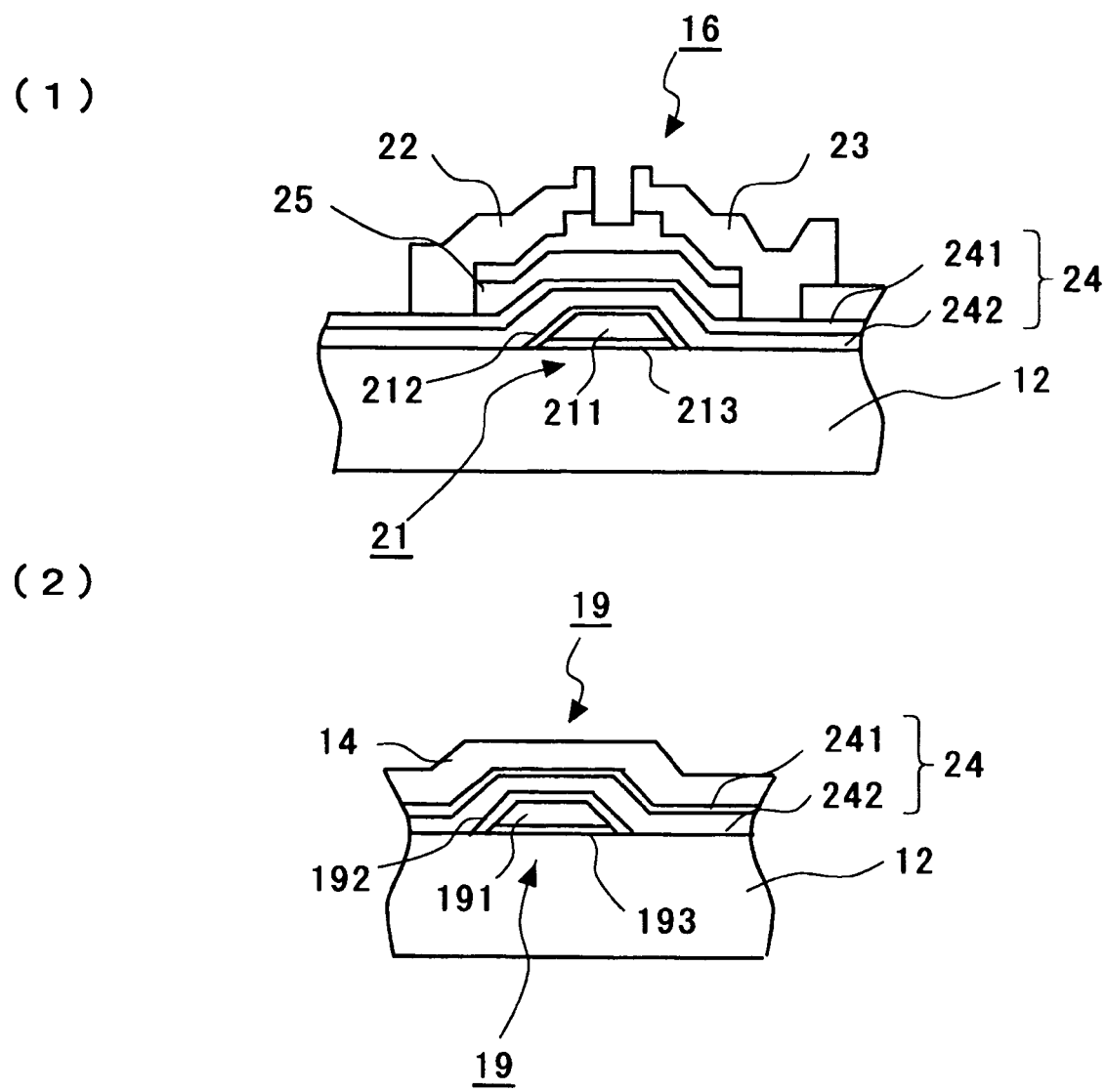
FIGS. 4A and 4B are schematic cross-sectional diagrams of a pixel configuration in the liquid crystal display device according to the invention, where FIG. 4(1) is a portion of the TFT transistor element, and FIG. 4(2) is a portion of the stored capacity line.

FIGS. 4A and 4B are schematic cross-sectional diagrams of a pixel configuration in the liquid crystal display device according to the invention, where FIG. 4(1) is a portion of the TFT transistor element, and FIG. 4(2) is a portion of the stored capacity line. In FIGS. 4A and 4B, enlarged cross-sections of the gate electrode 21 and the stored capacity line 19 integrally extending from, respectively, the TFT switching element 16 and the gate line 17 on the glass substrate 12 are shown, and the gate electrode 21 comprises a conductive layer 211 as a metal portion comprised of a Cu alloy, and oxide film layers 212, 213 covering the conductive layer. The oxide film layer 213 is also present between the conductive layer 211 and the substrate 12. Similarly, the stored capacity line 19 comprises a conductive layer 191 comprised of a Cu alloy, and oxide film layers 192, 193 covering the conductive layer. On the substrate 12 having formed thereon the gate electrode 21 and the metal lines 17, 19, an insulating film 24 comprised of a plurality of layers is deposited, and an a-Si layer 25 is formed in the TFT region on the upper surface, and further the drain electrode layer 22 and the source electrode 23 are formed. On the other hand, in the pixel region on the stored capacity line 19, the pixel electrode 14 comprised of ITO is formed and electrically connected to the source electrode layer 23. The drain electrode layer 22 is electrically connected to the signal line 18.

The stored capacity line 19 is described with reference to FIG. 4(2). A Cu alloy is first sputtered against the glass substrate 12 and etched to form a Cu alloy layer pattern for an address line 17, the gate electrode line 21, and the stored capacity line 19. The pattern is then subjected to heat treatment in an oxidative atmosphere containing a very small amount of oxygen to form the oxide film layers 212, 213 on the surface of the conductive layer 211 comprised of a Cu alloy. That is, the heat treatment oxidizes the surface of the Cu alloy to form the oxide film layers 212, 213. The oxide film layer 213 is also formed between the conductive layer 211 and the substrate 12.

Next, an SiOx insulating layer 241 and an SiNx film 242 are stacked on one another as the insulating film 24 by sputtering and a CVD process, and further the undoped a-Si layer 25 is formed. The ITO pixel electrode 14 is then formed, followed by formation of a contact hole. Subsequently, a metal layer constituting the drain electrode 22 and the source electrode 23 is formed, and then the drain electrode 22 and the source electrode 23 are formed using an etching solution. The a-Si layer 25 is then etched by CDE to form an SiNx protecting film, and a hole is formed in the contact portion to produce the TFT portion 16.

In the liquid crystal display device according to the invention, the gate electrode 21 and the source/drain electrodes 22, 23 of the TFT and the wirings 17, 18, 19 connected to them are formed from a copper (Cu) alloy which contains an additive element having an oxide formation free energy smaller than that of Cu and having a diffusion coefficient in Cu larger than the self-diffusion coefficient of Cu.

EXAMPLE

First Embodiment

The above embodiment is explained in further detail below.

Using a Cu—Mn alloy of Cu having a purity of 99.9999 % and Mn having a purity 99.98% as a sputtering target material, a Cu-7 at. % Mn alloy thin film was formed on an Si substrate having $SiO_2$ on its surface. The resultant alloy thin film was subjected to heat treatment in an Ar gas atmosphere (oxygen content: 100 ppm) at 400° C. for 30 minutes. Element concentration distribution in the thicknesswise direction of a specimen from the surface was then determined using secondary ion mass spectrometry (SIMS).

Figure 5:
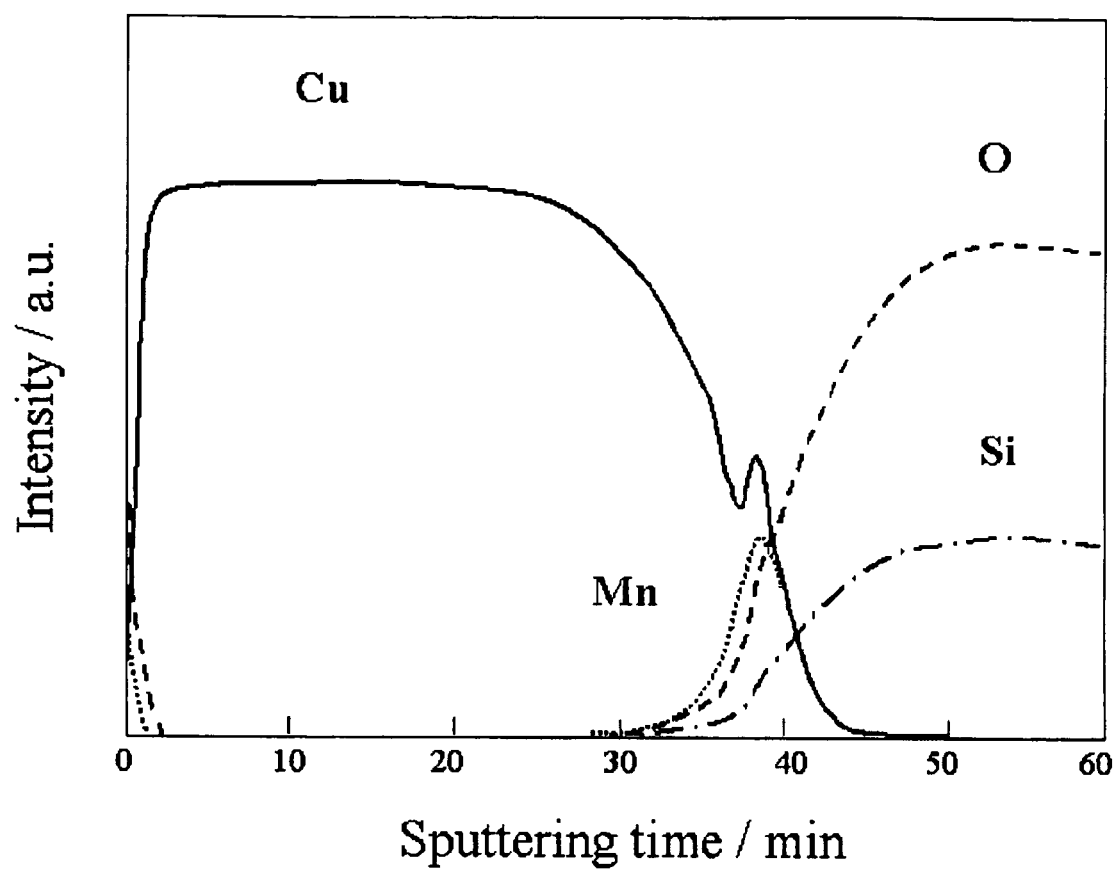
FIG. 5 shows results of a concentration distribution determined by SIMS.

FIG. 5 shows results of the concentration distribution determined by the SIMS. A specimen was scraped by an ion beam in the direction from the surface of the thin film to $SiO_2$ and mass of secondary ions being sputtered from the specimen was continuously measured to determine the concentration distribution inside the specimen. It has been found that MnOx is present on the surface. The presence of Cu, Mn, Si, and O is observed in the position of specimen corresponding to the sputtering time of 35 to 40 minutes. This indicates an oxide film layer comprised of a composite oxide formed at the interface.

Figure 6:
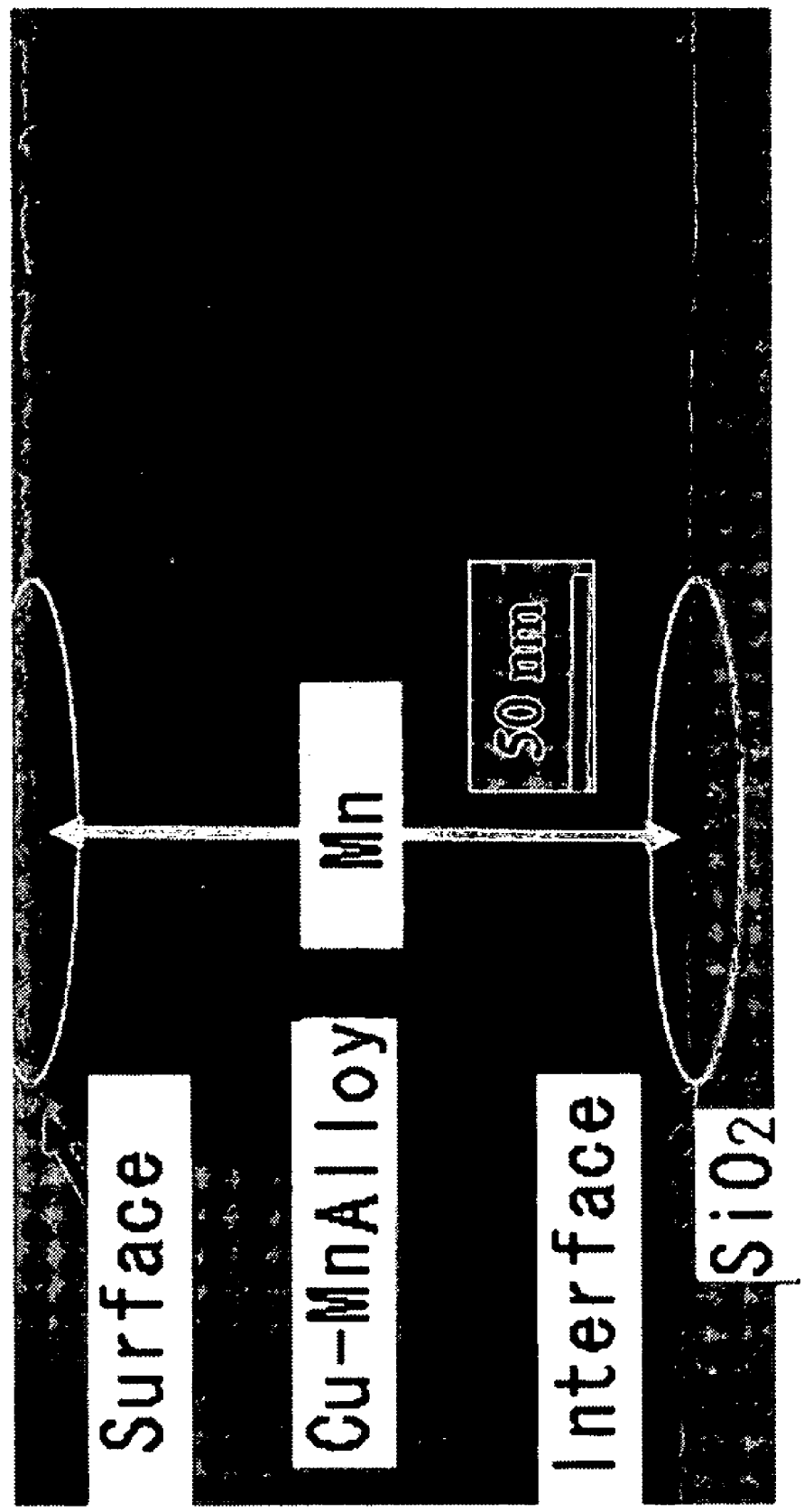
FIG. 6 is a photograph of a cross-section examined under a transmission electron microscope (TEM)
Figure 7:
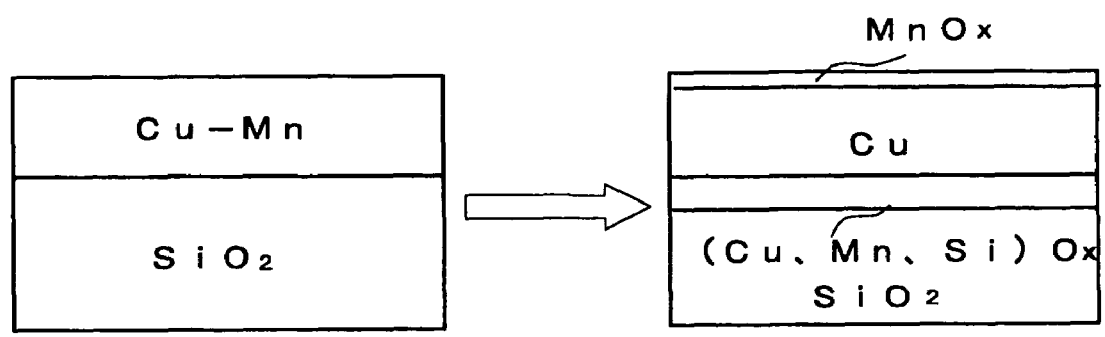
FIG. 7 is a schematic diagram of a state where an oxide film layer is formed at an interface between Cu and $SiO_2$ about an interface between the Cu—Mn alloy and $SiO_2$.

FIG. 6 is a photograph of a cross-section examined under a transmission electron microscope (TEM). FIG. 7 is a schematic diagram of a state where an oxide film layer is formed at the interface between Cu and $SiO_2$ about the interface between the Cu—Mn alloy and $SiO_2$. The examination under a transmission electron microscope (TEM) has confirmed that new layers are formed on both sides of the Cu—Mn alloy. The peak intensities of Cu and Si include the intensity of the adjacent layer, but it is clear that an oxide containing Mn is formed. This oxide film layer grown at 450° C. to have the maximum thickness of about 8 nm and did not grow any thicker.

Embodiments of the liquid crystal display device are explained below in further details.

Second Emnbodiment

In a channel etched amorphous silicon (a-Si) TFT liquid crystal display device, the gate wiring shown in FIG. 2 is formed as follows. A Cu-2 at. % Mn alloy thin film is first formed on a washed glass substrate using a Cu-2 at. % Mn alloy of Cu having a purity of 99.9999% and Mn having a purity of 99.98% as a target material. A wiring pattern for gate line is formed on the resultant alloy thin film by a photoresist process and a dry etching process. The pattern is then subjected to heat treatment in an Ar gas atmosphere (oxygen content: 100 ppm) at 400° C. for 30 minutes. Stable oxide layers are formed at the interface between the Cu—Mn alloy and the glass substrate and on the surface of the Cu—Mn alloy.

Third Embodiment

Figure 8:
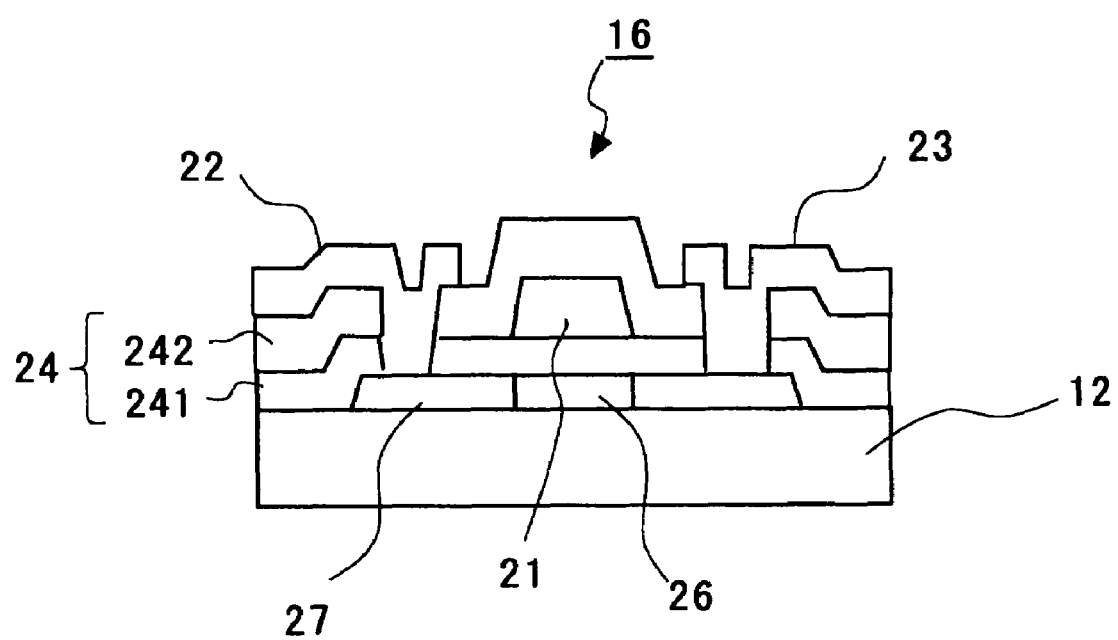
FIG. 8 is a schematic diagram of planar p-Si TFT.

A planar polysilicon (p-Si) TFT liquid crystal display device is produced as follows. A p-Si film is first deposited on a washed glass substrate by a plasma enhanced chemical vapor deposition (PECVD) process, and then thoroughly subjected to laser annealing. The p-Si film is patterned and then an $SiO_2$ gate insulator film is formed by a CVD process. A film of a Cu-2 at. % Mn alloy is then formed by a sputtering process and etched to form a gate electrode. Next, the resultant substrate is subjected to heat treatment in a vacuum at 400° C. for 30 minutes. The substrate is subsequently doped with an impurity by an ion doping process, and a source and a drain are formed in a self-alignment manner, forming an interlayer dielectric film. The resultant substrate is then subjected to heat treatment at 400° C. for 30 minutes. FIG. 8 is a schematic diagram of thus formed planar polysilicon (p-Si) TFT through the above steps. In FIG. 8, an oxide comprised of Mn is formed on the gate insulator film and at the interface between the interlayer dielectric film and the Cu—Mn alloy wiring.

By the means for solving the problems, the invention provides a copper alloy which is advantageous in that it can form on the copper surface an oxide film layer having high adhesion to the copper surface without lowering the electrical conductivity of copper.

Further, by the means for solving the problems, the invention provides a liquid crystal display device having a wiring having formed on the surface thereof an oxide film layer having high adhesion to the wiring surface without lowering the electrical conductivity of the electric wiring layer. By virtue of having this wiring layer, the liquid crystal display device provided need not form an insulating layer comprised of an oxide by vapor deposition or the like and can form an oxide film layer merely by a heat treatment, thus simplifying the production process.

What is claimed is:

1. A liquid crystal display device comprising:
a pair of substrates;
a liquid crystal layer disposed between the substrates;

an electrode disposed on one of the substrates; and a wiring layer disposed on said one of the substrates, connected with the electrode and made of a copper alloy comprising copper and an element selected from the group consisting of Mn, Zn, Ga, Li, Ge, Sr, Ag, Ba, Pr and Nd, wherein a concentration of the element in the copper alloy is more than 0.1 and not more than 20 atomic percentage and within a solubility limit of the element in the copper.

2. A liquid crystal display device comprising:

a pair of substrates;

a liquid crystal layer disposed between the substrates;

an electrode disposed on one of the substrates; and a wiring layer disposed on said one of the substrates, connected with the electrode and made of a copper alloy consisting essentially of copper and manganese wherein a concentration of the manganese in the copper alloy is more than 0.1 and not more than 20 atomic percentage and within a solubility limit of the element in the copper.

3. The liquid crystal display device of claim 1, wherein atoms of the element are diffused into the copper so as to form an oxide film including the atoms, the oxide film being formed on a surface of the copper alloy.

4. The liquid crystal display device of claim 3, wherein a thickness of the oxide film is 1-10 nm.

5. The liquid crystal display device of claim 4, wherein an electric resistivity of the copper alloy is equal to or more than $1.7\ \mu\Omega cm$ and equal to or less than $7\ \mu\Omega cm$.

6. The liquid crystal display device of claim 2, wherein an oxide film including the manganese has a thickness of 1-10 nm, the oxide film being formed on a surface of the copper alloy.

7. The liquid crystal display device of claim 6, wherein an electric resistivity of the copper alloy is equal to or more than $1.7\ \mu\Omega cm$ and equal to or less than $7\ \mu\Omega cm$.

8. The liquid crystal display device of claim 2, wherein an electric resistivity of the copper alloy is equal to or more than $1.7\ \mu\Omega cm$ and equal to or less than $7\ \mu\Omega cm$.

* * * * *